(12) United States Patent
Riedel et al.

(10) Patent No.: US 10,930,890 B2
(45) Date of Patent: Feb. 23, 2021

(54) ORGANIC OPTOELECTRONIC COMPONENT

(71) Applicant: PICTIVA DISPLAYS INTERNATIONAL LIMITED, Dublin (IE)

(72) Inventors: Daniel Riedel, Munich (DE); Nina Riegel, Tegernheim (DE); Thomas Wehlus, Lappersdorf (DE); Arne Fleissner, Regensburg (DE); Armin Heinrichsdobler, Regensburg (DE)

(73) Assignee: PICTIVA DISPLAYS INTERNATIONAL LIMITED, Dublin (IE)

( * ) Notice: Subject to any disclaimer, the term of this patent is extended or adjusted under 35 U.S.C. 154(b) by 0 days.

(21) Appl. No.: 16/995,879

(22) Filed: Aug. 18, 2020

(65) Prior Publication Data
US 2020/0381666 A1  Dec. 3, 2020

Related U.S. Application Data

(63) Continuation of application No. 16/087,306, filed as application No. PCT/EP2017/056549 on Mar. 20, 2017, now Pat. No. 10,804,497.

(30) Foreign Application Priority Data

Mar. 21, 2016  (DE) .................. 10 2016 105 198

(51) Int. Cl.
*H01L 29/08*  (2006.01)
*H01L 51/52*  (2006.01)

(52) U.S. Cl.
CPC ...... *H01L 51/5268* (2013.01); *H01L 51/5253* (2013.01)

(58) Field of Classification Search
CPC ................. H01L 51/5268; H01L 51/5253
See application file for complete search history.

(56) References Cited

U.S. PATENT DOCUMENTS 9,000,443 B2 * 4/2015 Hatano ............... H01L 27/1266
257/72
9,030,091 B2 * 5/2015 Park .................... H01L 51/5268
313/503
(Continued)

FOREIGN PATENT DOCUMENTS

DE  10 2012 200 084 A1  7/2013
DE  10 2014 218 667 A1  3/2016
(Continued)

*Primary Examiner* — Caleb E Henry
(74) *Attorney, Agent, or Firm* — Botos Churchill IP Law LLP

(57) ABSTRACT

An organic optoelectronic component includes an organic functional layer stack between a first electrode and a second electrode including a light-emitting layer formed to emit radiation during operation of the component; a coupling-out layer arranged above the first electrode and/or the second electrode which is in a beam path of the radiation of the light-emitting layer; and a protective layer above the coupling-out layer, wherein the coupling-out layer includes a structured layer and a planarization layer arranged thereabove and the structured layer has a structured surface structured at least in places, the planarization layer planarizes the structured surface of the structured layer, the protective layer cannot be removed without at least partially destroying the coupling-out layer, and adhesion of the structured layer to the planarization layer is smaller than adhesion of the protective layer to the planarization layer.

13 Claims, 2 Drawing Sheets

(56) References Cited

U.S. PATENT DOCUMENTS

| | | | |
|---|---|---|---|
| 9,091,415 B2 * | 7/2015 | Bessho | F21V 9/40 |
| 9,099,415 B2 * | 8/2015 | Park | H01L 27/3246 |
| 9,123,914 B2 * | 9/2015 | Lee | H01L 51/5212 |
| 9,147,856 B2 * | 9/2015 | Cho | H01L 51/5268 |
| 9,182,631 B2 * | 11/2015 | Iwata | H01L 51/5268 |
| 9,184,415 B2 * | 11/2015 | Hirakata | H01L 51/5281 |
| 2012/0091923 A1 | 4/2012 | Kastner-Jung et al. | |
| 2012/0112225 A1 | 5/2012 | Le Bellac et al. | |
| 2013/0285088 A1 | 10/2013 | Xia et al. | |
| 2014/0264293 A1 | 9/2014 | Hatwar et al. | |
| 2015/0014668 A1 | 1/2015 | Dobbertin et al. | |
| 2015/0123093 A1 | 5/2015 | Reusch et al. | |
| 2017/0317310 A1 | 11/2017 | Schwamb et al. | |

FOREIGN PATENT DOCUMENTS

| | | |
|---|---|---|
| DE | 10 2016 101 517 A1 | 8/2017 |
| EP | 2 278 852 A1 | 1/2011 |
| EP | 2 378 837 A1 | 10/2011 |
| WO | 2010/066245 A1 | 6/2010 |
| WO | 2014/022482 A1 | 2/2014 |
| WO | 2015/143102 A1 | 9/2015 |

* cited by examiner

ORGANIC OPTOELECTRONIC COMPONENT

Cross-Reference to Related Applications

The present application is a continuation of U.S. Application No. 16/087,306, filed Sep. 21, 2018, which is a national phase entry under 35 U.S.C. § 371 of International Application No. PCT/EP2017/056549, filed Mar. 20, 2017, which claims priority from D.E. Application No. 10 2016 105 198.5, filed Mar. 21, 2016.

TECHNICAL FIELD

This disclosure relates to an organic optoelectronic component.

BACKGROUND

In organic optoelectronic components such as organic light-emitting diodes (OLEDs), only a part of the electromagnetic radiation generated in the light-emitting layer is coupled out to the surroundings. The remaining part of the radiation is distributed to various loss channels, for example, in radiation, which is guided in the substrate or in organic layers by wave guiding effects. Without technical measures, only one quarter of the generated radiation is coupled out to the surroundings, while the remaining radiation is lost due to wave guiding effects and total reflection. For manufacturers of such components, it is desirable to keep secret the technical measures used to increase the radiation output and thus the coupling-out technology so that the organic optoelectronic components cannot be analyzed, copied or falsified or only with difficulty.

There is thus a need to provide an organic optoelectronic component, which coupling-out technology cannot be analyzed or is hampered and copy protected.

SUMMARY

We provide an organic optoelectronic component including an organic functional layer stack between a first electrode and a second electrode including a light-emitting layer formed to emit a radiation during operation of the component, and a coupling-out layer arranged above the first electrode and/or the second electrode which is in a beam path of the radiation of the light-emitting layer, wherein the coupling-out layer includes a structured layer and a planarization layer arranged thereabove and the structured layer has a structured surface structured at least in places, the planarization layer planarizes the structured surface of the structured layer, and a difference in the refractive indices of the structured layer and the planarization layer is smaller than 0.3 at least in places.

We also provide an organic optoelectronic component including an organic functional layer stack between a first electrode and a second electrode including a light-emitting layer formed to emit radiation during operation of the component, a coupling-out layer arranged above the first electrode and/or the second electrode which is in a beam path of the radiation of the light-emitting layer, and a protective layer above the coupling-out layer, wherein the coupling-out layer includes a structured layer and a planarization layer arranged thereabove and the structured layer has a structured surface structured at least in places, the planarization layer planarizes the structured surface of the structured layer, the protective layer cannot be removed without at least partially destroying the coupling-out layer, and adhesion of the structured layer to the planarization layer is smaller than adhesion of the protective layer to the planarization layer.

Figure 1A:
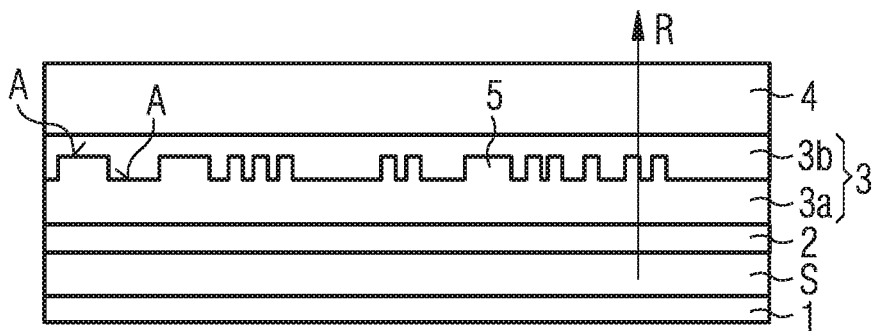
FIGS. 1A, 2, 3 and 4A show schematic side views of examples of organic optoelectronic components.

REFERENCE SIGN LIST 1 first electrode
2 second electrode
3 coupling-out layer
3a structured layer
3b planarization layer
4 protective layer
5 structure
A structured surface
S organic layer stack
R beam path

DETAILED DESCRIPTION

Our organic optoelectronic component may comprise an organic functional layer stack. The organic functional layer stack is arranged between a first electrode and a second electrode. The organic functional layer stack comprises a light-emitting layer formed to emit radiation or light during operation of the component. The light-emitting layer is preferably formed to emit light during operation of the component in the visible range of the electromagnetic spectrum, for example, white light.

The fact that one layer or one element is arranged "between" two other layers or elements, can mean that the one layer or the one element is arranged directly in direct mechanical and/or electrical contact or in indirect contact with one of the two other layers or elements or in direct mechanical and/or electrical contact or in indirect contact with other layers or elements. In indirect contact, further layers and/or elements can then be arranged between the one and at least one of the two other layers or between the one and at least one of the two other elements.

The organic optoelectronic component may comprise a coupling-out layer arranged in the beam path of the radiation of the light-emitting layer. In particular, the coupling-out layer is arranged above the first and/or the second electrode.

The fact that a layer or an element is arranged or applied "on" or "above" another layer or another element, can mean that the one layer or the one element is arranged directly in direct mechanical and/or electrical contact on the other layer or the other element. Furthermore, it can also mean, that the one layer or the one element is arranged indirectly on or above the other layer or the other element. In this example, further layers and/or elements can then be arranged between the one and the other layer or between the one or the other element.

The coupling-out layer may comprise a structured layer and a planarization layer arranged thereabove or consists of these layers. The coupling-out layer increases the coupling-out of radiation generated in the light-emitting layer or the light generated in the light-emitting layer.

The structured layer may have a structured surface structured at least in places, and the planarization layer planarizes the structured surface of the structured layer. The fact that the planarization layer planarizes the structured surface of the structured layer means in particular that the planarization layer adapts to the surface of the structured layer. In particular, the planarization layer fills recesses of the surface of the structured layer, which are produced by the structuring of the surface of the structured layer, without gaps, in a form-fitting and/or complete manner. The coupling-out layer comprises the structured layer and the planarization layer arranged thereabove has in particular a smooth surface. The layer thicknesses of the planarization layer and the structured layer can thus vary over their area in this example, while the layer thickness of the coupling-out layer is constant or constant within the scope of production conditions. In particular, the planarization layer completely covers the structured layer.

The fact that the structured layer has a structured surface structured at least in places may mean that the surface is structured only in places or over the entire surface. For example, the surface of the structured layer may only be structured laterally, that is to say in a plan view from above onto this layer on the outer sides.

The difference in the refractive indices of the structured layer and of the planarization layer may be less than 0.3, preferably less than 0.2, at least in places, particularly preferably less than 0.1. In particular, the difference between the refractive indices of the structured layer and the planarization layer at the places at which the planarization layer is arranged above the structures of the structured layer is less than 0.3, preferably less than 0.2, particularly preferably less than 0.1. Very particularly preferably, the refractive index of the structured layer and of the planarization layer is the same at least in places. Due to the small differences in the refractive indices, the structuring of the structured layer is not visible for a viewer from outside the organic optoelectronic component. Since the structuring of the surface of the structured layer within the coupling-out layer substantially contributes increasing the coupling-out of light, a viewer cannot recognize the structuring from outside so that the coupling-out technology used cannot be detected. A post-construction of the organic optoelectronic component is thus made more difficult or prevented. In other words, a post-construction can be prevented and thus a kind of copy protection can be achieved.

The organic optoelectronic component may comprise a substrate. The substrate can comprise, for example, one or more materials in the form of a layer, a plate, a film or a laminate selected from quartz, glass, plastic, metal, and silicon wafer. In particular, the substrate contains glass or consists thereof.

The first electrode may be arranged on the substrate, in particular in direct mechanical contact with the substrate. The first electrode is in particular designed as an anode.

At least one of the electrodes may be transparent. A layer is referred to as transparent, which is permeable to the radiation generated in the light-emitting layer, in particular for visible light. In this example, the transparent layer can be clearly translucent or at least partially light-diffusing or partially light-absorbing so that the transparent layer can, for example, also be diffusely or milky translucent. Particularly preferably, a layer referred to here as transparent, is as light-transmissive as possible so that in particular the absorption of the radiation generated during operation of the component in the light-emitting layer of the organic functional layer stack is as low as possible.

In the organic optoelectronic component, for example, the first electrode may be transparent and the second electrode may be formed to be reflective. The organic optoelectronic component can thus be formed as a bottom emitter. Alternatively, for example, the first electrode may be formed reflective and the second electrode may be formed transparent. The organic optoelectronic component can thus be formed as a top emitter.

Both electrodes may be transparent. The radiation generated in the light-emitting layer of the organic functional layer stack can thus be transmitted in both directions that is to say through both electrodes. In the event that the organic optoelectronic component has a substrate, this means that the radiation passes through the substrate, which is then likewise transparent, and may be radiated into the direction facing away from the substrate. Furthermore, in this example, all layers of the organic optoelectronic component may be transparent so that the organic optoelectronic component forms a transparent organic light-emitting diode.

In particular, the coupling-out layer is arranged above the electrode which is transparent. If the OLED is a transparent OLED, the first and the second electrode are transparent, the coupling-out layer may be formed over both electrodes. The coupling-out layer is preferably located on the main surface of the first and/or second electrode facing away from the organic layer stack.

The coupling-out layer may be transparent.

A transparent electrically conductive oxide, for example, may be used as a material for a transparent electrode. Transparent electrically conductive oxides ("TCO" for short) are transparent electrically conductive materials, generally metal oxides such as, for example, zinc oxide, tin oxide, cadmium oxide, titanium oxide, indium oxide or indium tin oxide (ITO). In addition to binary metal-oxygen compounds such as, for example, $ZnO$, $SnO_2$ or $In_2O_3$, also ternary metal-oxygen compounds belong to the group of TCOs such as, for example, $Zn_2SnO_4$, $CdSnO_3$, $ZnSnO_3$, $MgIn_2O_4$, $GaInO_3$, $Zn_2In_2O_5$ or $In_4Sn_3O_{12}$, or mixtures of different transparent conductive oxides. Furthermore, it may be possible that the TCOs do not necessarily correspond to a stoichiometric composition and may also be p- or n-doped.

The material used for a reflecting electrode may be, inter alia, in particular aluminum, barium, indium, silver, gold, magnesium, calcium, copper or lithium and compounds, combinations and alloys thereof prove to be advantageous. These materials may also be used for transparent electrodes. The transparency can be adjusted by the layer thickness of the electrode. Silver nanowires may also be used for transparent electrodes.

The organic functional layer stack may be arranged on the first electrode. The first electrode may be arranged on a substrate.

The organic functional layer stack has at least one light-emitting layer. The light-emitting layer may comprise organic polymers, organic oligomers, organic monomers, organic small non-polymeric molecules ("small molecules") or combinations thereof. Furthermore, the light-emitting layer can be an electroluminescent layer. Materials having a radiation emission on the basis of fluorescence or phosphorescence are suitable as materials for this purpose, for example, polyfluorene, polythiophene or polyphenylene or derivatives, compounds, mixtures or copolymers thereof.

The organic functional layer stack may comprise further functional layers such as, for example, hole injection layers, hole-blocking layers, electron-transport layers, electron-blocking layers and/or electron-injection layers.

The organic optoelectronic component may be formed as an organic light-emitting diode (OLED).

The organic optoelectronic component may have at least one encapsulation layer. In this example, an encapsulation layer is a device set up for the purpose of forming a barrier to atmospheric substances, in particular moisture and oxygen. In other words, the encapsulation layer is formed such that the encapsulation layer is permeated by atmospheric substances such as water or oxygen, at most to very small proportions.

The encapsulation layer may be a thin-film encapsulation layer. The thin-film encapsulation layer may have one or more thin layers applied, for example, by chemical vapor deposition (CVD) or PECVD ("plasma enhanced chemical vapor deposition") and/or an atomic layer deposition method (ALD) and, for example, contain one or more materials silicon oxide, silicon carbide, silicon nitride, aluminum oxide, tin oxide, zirconium oxide, titanium oxide, hafnium oxide, lanthanum oxide and tantalum oxide. The encapsulation layer may furthermore be a mechanical protection in the form of a plastic layer and/or a laminated glass layer and/or laminated metal foil, for example, made of aluminum. In this way, for example, a scratch protection may be achieved.

Alternatively, other encapsulation layers are also possible, for example, in the form of a glued-on glass cover. In particular, the glass lid or the glass is arranged on a thin-film encapsulation by an adhesive or an adhesive layer.

With regard to the basic structure of an organic optoelectronic component, for example, with regard to the structure, the layer composition and the materials are referred to in WO 2010/066245 A1, the subject matter of which is incorporated herein by reference in relation to the structure, the layer composition and the materials.

The organic optoelectronic component may comprise a protective layer arranged above the coupling-out layer. The protective layer is in particular transparent.

The planarization layer may be formed from a material having adhesive properties, for example, an adhesive.

The protective layer may be irreversibly bonded to the planarization layer. This means that the protective layer cannot be removed from the component without destroying the coupling-out layer because the planarization layer is at least partially, preferably completely, detached as well.

Preferably, adhesion of the planarization layer to the structured layer is lower than adhesion of the planarization layer to the protective layer. In other words, the planarization layer adheres more strongly to the protective layer than to the structured layer.

The protective layer may be irreversibly bonded to the planarization layer and the structured layer is reversibly connected to the planarization layer. This means that the protective layer cannot be removed from the component without destroying the coupling-out layer because the planarization layer is at least partially, preferably completely, completely detached too. The structured layer, however, is preferably not detached and thus remains above the first and/or second electrode.

If the protective layer is removed from the outside, the planarization layer is also removed at the same time so that the structures of the structured layer become irreversibly visible. Irreversible means that the planarization layer can no longer be applied to the structured layer in a precisely fitting manner or only with difficulty. As a result, after the protective layer has been removed in conjunction with the planarization layer, the organic optoelectronic component can no longer be optically examined in a reasonable manner. The emission spectrum of the component is changed by the irreversible destruction of the coupling-out layer compared to the emission spectrum of the component in the original state. The measurement of the spectrum of the organic optoelectronic component is thus no longer possible, and the coupling-out technology can thus be masked. In addition, the technical benchmarking of competitors is made more difficult. The combination of the coupling-out layer with the protective layer thus forms an easily detectable copy protection.

The structuring of the structured layer may be carried out periodically or nonperiodically. The structures may be lens-shaped, that is to say with convex or concavely curved surfaces, pyramid-shaped, truncated pyramid-shaped, truncated cone-shaped, rectangular, square or similar. The structures may, for example, be photolithographically produced structures, microlenses, holographic grating structures or structures for generating coherent optical effects. It is also possible for the structures to be produced by embossing, printing or laser engraving. The printing can be effected, for example, by inkjet printing. By the structuring, the coupling-out of light may be improved, for example, by light scattering.

The structured layer may have structures, in particular topographical structures, having structure sizes of 1 nm to 100 µm, preferably 0.5 µm to 100 µm, particularly preferably 5 to 50 µm. The structure sizes may be the lateral and/or the vertical extent. The interspaces between the topographical structures are in particular filled up gap-free, form-fit and/or complete by the planarization layer and the structures and the structured layer are completely covered by the planarization layer. The structures may in particular also differ in their structure sizes, that is to say structures of different structure sizes may be present.

The coupling-out layer may have a refractive index at least in places adapted to the refractive index of the functional layers of the organic functional layer stack. In particular, the refractive index of the coupling-out layer and the refractive index of the functional layers of the organic functional layer stack may be the same. The maximum possible light output can thus be achieved.

The coupling-out layer may have a refractive index of approximately 1.8 at least in places. In particular, both the structured layer and the planarization layer have a refractive index of approximately 1.8 at least in places, wherein the difference between the refractive indices of the structured layer and the planarization layer is less than 0.3 at least in places, preferably less than 0.2 at least in places, particularly preferably less than 0.1 at least in places. Compared to a direct coupling out of the radiation generated in the light-emitting layer in air having a refractive index of approximately 1, the loss of radiation may be reduced due to waveguide effects or total reflection at the interface of the electrode/coupling-out layer compared to the electrode/air and thus improving the coupling-out of light.

The planarization layer and/or the structured layer and/or the protective layer may comprise a polymer or consist of a polymer, wherein the polymer is preferably selected from a group comprising polyimides, polyacrylates, epoxy resins and silicones. For example, it can be polymethyl methacrylate. The polymers have in particular a refractive index of approximately 1.5. The polymers have adhesive properties. Thus, both the structured layer and the protective layer may adhere to the planarization layer.

The planarization layer and/or structured layer and/or the protective layer may comprise nanoparticles, in particular highly refractive nanoparticles. By the nanoparticles, it is possible to increase the refractive index of the layer. For example, the refractive index of the planarization layer and/or of the structured layer and/or of the protective layer comprising a polymer and nanoparticles can thus be 1.8.

The nanoparticles may have a size of 1 nm to 100 nm, preferably 5 nm to 50 nm.

The nanoparticles, in particular the highly refractive nanoparticles, may be formed from a metal oxide, for example, $TiO_2$ or $ZrO_2$.

The planarization layer and the structured layer may comprise the same materials or consist of the same materials. It can thus be guaranteed that the refractive index is identical so that the structuring is not visible from the outside.

The polymers can be applied in liquid form to the structured layer so that a gap-free, form-fit and/or complete filling of the interspaces of the structures of the structured layer may be carried out and can thus be ensured.

A self-organizing monolayer may be formed between the structured layer and the planarization layer, also called self-assembled monolayer or SAM. The self-organizing monolayer may achieve an adhesion reduction between the structured layer and the planarization layer. As a result, for example, if the structured layer and the protective layer comprise the same material or consist of the same material, the adhesion or bond of the structured layer to the planarization layer is lower than the adhesion or adhesion of the protective layer to the planarization layer. As a result, during removal of the protective layer, the planarization layer is also removed at the same time and the coupling-out layer is thus destroyed.

The coupling-out layer may consist of the structured layer, the self-organizing monolayer and the planarization layer.

The self-organizing monolayer may consist of only one molecular layer. Depending on the material used, it may have, for example, a layer thickness of 0.1 nm to 10 nm. The optical properties of the organic optoelectronic component are thus not influenced or hardly influenced by this layer.

The self-organizing monolayer may be formed from thiols, silanes, silanols or phosphonates. For example, the self-organizing monolayer is formed from methyltrichlorosilane or methylthiol.

The structured layer may be a substrate, a scattering layer and/or an encapsulation layer. For example, the structured layer is the substrate on which the first electrode is arranged. However, it can also be a scattering layer or an encapsulation layer arranged on the substrate, preferably on the main surface of the substrate facing away from the layer stack.

If the structured layer is a scattering layer, scattering particles may be embedded in the structured layer. For example, the scattering particles can be $SiO_2$, $TiO_2$ or $ZrO_2$ particles. It is possible that the structured layer differs from the planarization layer only by the scattering particles. The structured layer may thus comprise a polymer, scattering particles and optionally nanoparticles or consists of these materials, and the planarization layer may comprise the same polymer and optionally the same nanoparticles or consists of these materials.

The encapsulation layer may be a thin-film encapsulation layer, a cover film or a lacquer layer. The thin-film encapsulation may be formed as described above and, for example, has silicon oxide, silicon carbide, silicon nitride, aluminum oxide, tin oxide, zirconium oxide, titanium oxide, hafnium oxide, lanthanum oxide and tantalum oxide.

The cover foil or lacquer layer may comprise the same materials as the planarization layer. They may therefore comprise a polymer or consist of a polymer. The polymer is preferably selected from a group comprising polyimides, polyacrylates, epoxy resins and silicones.

The structured layer may comprise or consist of quartz, glass or plastic, preferably glass. Glass has a refractive index of approximately 1.5, preferably 1.8. For example, the structured layer may comprise glass or consist of glass and the planarization layer may comprise or consist of polymethyl methacrylate. Glass and polymethyl methacrylate may have a refractive index of approximately 1.5. Glass having a refractive index of 1.8 may also be selected for the structured layer, and the planarization layer comprises polymethyl methacrylate and nanoparticles, wherein the refractive index of the planarization layer may be increased to 1.8 by the addition of the nanoparticles.

The protective layer may comprise or consist of quartz, glass or plastic. The protective layer may optionally contain scattering particles such as $TiO_2$ and can thus be formed to be light-scattering.

The difference between the refractive indices of the structured layer and of the planarization layer may be equal to or greater than 0.1 at least in places, preferably greater than 0.2, particularly preferably greater than 0.3. In particular in conjunction with suitable structure sizes, the structuring of the structured layer may be made visible to a viewer from outside the organic optoelectronic component in places. Thus, for example, letterings can be made visible with the manufacturer's logo. The greater the refractive index difference with a given structural size of the structures, the more clearly the structures can be made visible from the outside.

The refractive index of the planarization layer may be determined at least in places by adding nanoparticles, in particular high-index nanoparticles. The effective refractive index is obtained from the arithmetic mean of the volume fractions of the individual constituents, if the size of the components/particles is substantially smaller, preferably smaller than 100 nm, than the wavelength.

The planarization layer may comprise nanoparticles, in particular highly refractive nanoparticles, at least in places. By the nanoparticles, it is possible to lift the refractive index of the layer in places. For example, the refractive index of the planarization layer comprising a polymer and nanoparticles can thus be approximately 1.8 in places. For example, the structured layer may comprise glass and has a refractive index of 1.5. The planarization layer may be formed in places from polymethyl methacrylate and therefore has a refractive index of 1.5 at these places, and comprises at places polymethyl methacrylate and nanoparticles, and thus has a higher refractive index than 1.5, for example, 1.8, at these places. Structures above which the planarization layer is applied having a refractive index of 1.5 are then not visible from the outside, while the structures above which the planarization layer is applied having a refractive index of 1.8 are visible from the outside.

The nanoparticles may have a size of 1 nm to 100 nm, preferably 5 nm to 50 nm.

The nanoparticles may be formed from a metal oxide, for example, $TiO_2$ or $ZrO_2$.

The planarization layer may comprise pores or low-refractive nanoparticles in places. In this example, low-refractive nanoparticles mean that they have a lower refractive index than the polymer used for the planarization layer. As a result, it is possible to reduce the refractive index of the layer in places.

The planarization layer may comprise pores or low-refractive nanoparticles in places. In this example, low-refractive nanoparticles mean that they have a lower refractive index than the polymer used for the planarization layer. As a result, it is possible to reduce the refractive index of the layer in places.

The planarization layer may be arranged only in the middle or laterally, having a difference in the refractive indices from the structured layer which is greater than 0.1, preferably greater than 0.2, and particularly preferably greater than 0.3. A lateral arrangement means that in a plan view from above, the planarization layer is arranged, for example, on an outer side of the surface, having a difference in the refractive indices to the structured layer greater than 0.1, preferably greater than 0.2, particularly preferably greater than 0.3. It is thus possible to make a structuring of the structured layer visible to a viewer from outside the organic optoelectronic component in the plan view in the center or on at least one outer side.

Further advantages and developments emerge from the examples described below in conjunction with the figures.

Identical, similar or identically acting elements are provided with the same reference numerals in the figures. The figures and the size ratios of the elements illustrated in the figures relative to one another are not to be regarded as being to scale. Rather, individual elements, in particular layer thicknesses, may be illustrated on an exaggeratedly large scale for greater ease of depiction and/or better comprehension.

Figure 1B:
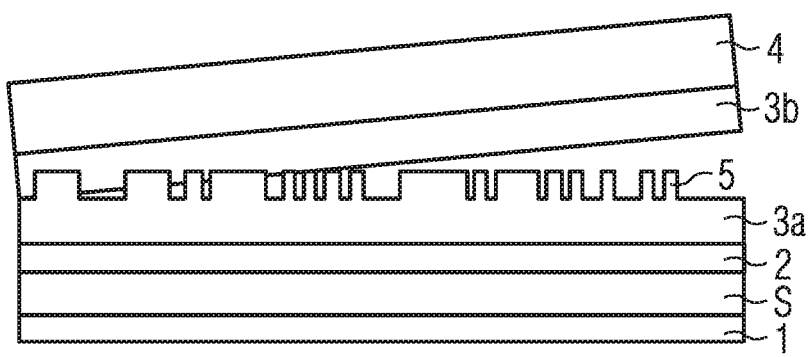
FIG. 1B shows a side view of an example of an organic optoelectronic component during the detachment of the protective layer.

FIG. 1A shows a schematic side view of an example of an organic optoelectronic component. The organic optoelectronic component comprises a layer sequence S arranged between a first electrode 1 and a second electrode 2. The layer sequence S comprises a light-emitting layer (not shown) that emits electromagnetic radiation in the visible region of the electromagnetic spectrum during operation of the component. The first electrode 1 is formed to be reflective and consists, for example, of aluminum, and the second electrode 2 is transparent and consists of ITO. The optoelectronic component is formed as a top emitter. The first electrode 1 may be arranged on a substrate (not shown here). A coupling-out layer 3 is arranged above the second electrode 2. The coupling-out layer 3 is transparent to the radiation generated in the light-emitting layer and consists of a structured layer 3a and a planarization layer 3b. The structured layer 3a has a structured surface A. The structured layer 3a has structures 5 with structure sizes of 1 nm to 100 µm. The structures may have, for example, a lateral extent of 50 nm and a vertical extent, that is to say a height of 1 µm. The structured layer 3a consists of glass with a refractive index of about 1.8. The planarization layer 3b is arranged above the structured layer 3a. The planarization layer 3b covers the structured layer 3a completely or over the entire surface, in particular, the planarization layer 3b fills interspaces between the structures 5 gap-free, form-fit and completely. The planarization layer 3b is formed from polymethyl methacrylate and nanoparticles and has a refractive index of approximately 1.8. The structures 5 are thus not visible to a viewer from outside the organic optoelectronic component. Thus, the structure of the coupling-out layer 3 cannot be detected from the outside. A post-construction of the organic optoelectronic component is thus made more difficult or prevented. A protective layer 4 is arranged above the coupling-out layer 3. The coupling-out layer 3 and the protective layer 4 are located in the beam path R of the radiation generated by the light-emitting layer in the organic functional layer stack S. The protective layer 4 may be, for example, a thin-film encapsulation layer made of silicon nitride. The protective layer 4 is irreversibly bonded to the planarization layer 3b, while the structured layer 3a is reversibly connected to the planarization layer 3b. The adhesion of the planarization layer 3b to the structured layer 3a is thus lower than the adhesion of the planarization layer 3b to the protective layer 4. If the protective layer 4 is removed, as illustrated in FIG. 1B, the planarization layer 3b is also removed at the same time so that the structures 5 of the structured layer 3a become irreversibly visible. After detachment, the planarization layer 3b can no longer be applied to the structured layer 3a in a precisely fitting manner or only with difficulty. As a result, after the protective layer 4 has been removed in conjunction with the planarization layer 3b, the organic optoelectronic component can no longer be optically examined in a reasonable manner. The emission spectrum of the component is altered by the irreversible destruction of the coupling-out layer 3 compared to the emission spectrum of the component in the original state, as illustrated in FIG. 1A. Measurement of the spectrum of the organic optoelectronic component is thus no longer possible, and the coupling-out technology may be masked. The combination of the coupling-out layer 3 with the protective layer 4 thus forms an easily detectable copy protection.

Figure 2:
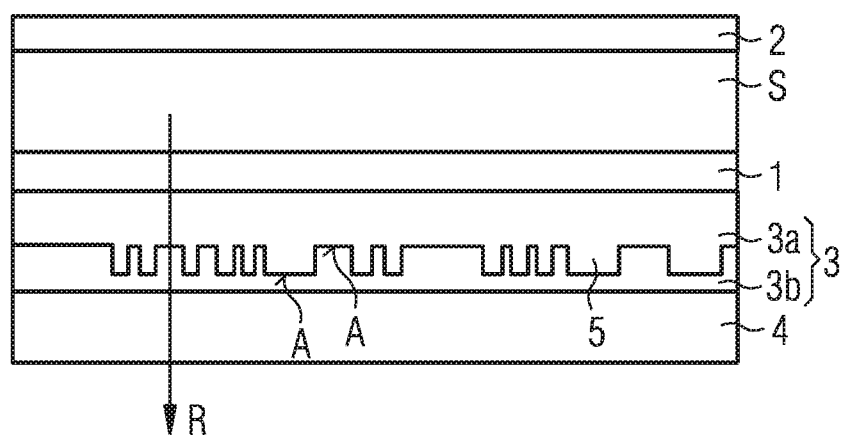

FIG. 2 shows a schematic side view of an example of an organic optoelectronic component. Compared to the optoelectronic component in FIG. 1A, the optoelectronic component in FIG. 2 is a bottom emitter. In this example, the coupling-out layer 3 is arranged above the first electrode 1, in particular over the main surface of the first electrode 1 facing away from the organic functional layer stack S. The first electrode 1 may be formed as an anode and may consist of ITO. The structured layer 3a is the substrate above which the first electrode 1 is arranged and consists, for example, of glass. The second electrode 2 is formed as a cathode and being reflective and consists, for example, of silver. The coupling-out layer 3 and the protective layer 4 are constructed as described in FIG. 1A.

Figure 3:
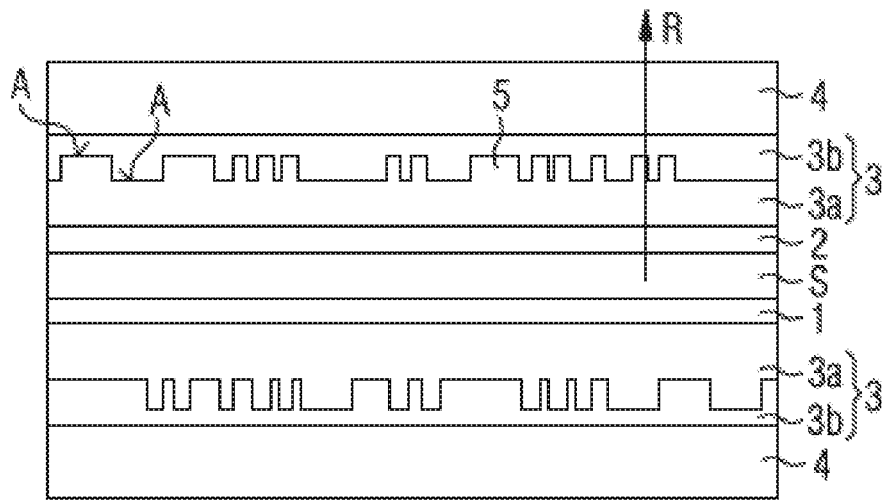

FIG. 3 shows a schematic side view of an example of an optoelectronic component. The optoelectronic component is formed as a transparent OLED. This means that the radiation is emitted to the surroundings via the first electrode 1 and via the second electrode 2. Compared to FIGS. 1A and 2, the coupling-out layer 3 and the protective layer 4 are located above the first electrode 1 and above the second electrode 2. The two electrodes 1 and 2 are formed to be transparent.

Figure 4A:
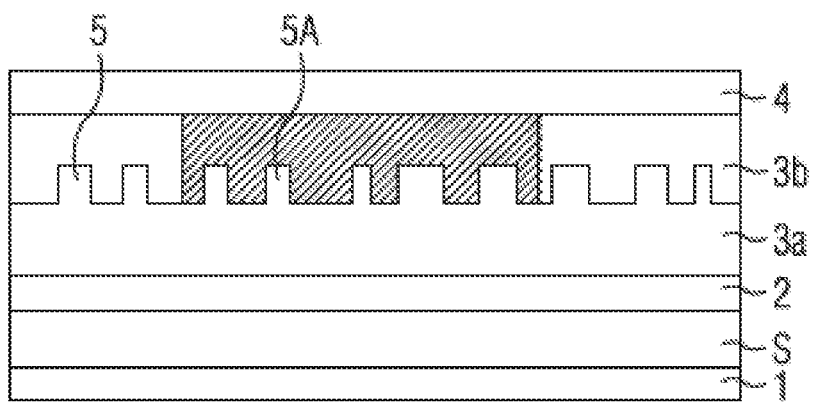
Figure 4B:
FIG. 4B shows a plan view of an example of an organic optoelectronic component.

FIG. 4A shows a schematic side view of an organic optoelectronic component. Compared to the component of FIG. 1A, the difference between the refractive indices of the structured layer 3a and the planarization layer 3b is equal to or greater than 0.1 in places, preferably greater than 0.2, particularly preferably greater than 0.3. In the illustration, the hatched region of the planarization layer 3b has a refractive index which is at least 0.1 different than the structured layer 3a. For example, the structured layer 3a comprises a glass having a refractive index of 1.5. The planarization layer 3b consists of polymethyl methacrylate having a refractive index of 1.5 and in the hatched region of polymethyl methacrylate and nanoparticles having a refractive index of 1.8. The structuring in the hatched region can thus be made visible to a viewer from outside the organic optoelectronic component. This is illustrated in FIG. 4B that shows a plan view from above onto an optoelectronic component, in particular onto the protective layer 4, and in which a lettering is visible in the center.

The description made with reference to examples does not restrict our components and methods to the examples. Rather, this disclosure encompasses any novel feature and any combination of features, including in particular any combination of features in the appended claims, even if the feature or combination is not itself explicitly indicated in the claims or examples.

This application claims priority of DE 10 2016 105 198.5, the subject matter of which is incorporated herein by reference.

The invention claimed is:

1. An organic optoelectronic component comprising:
   an organic functional layer stack between a first electrode and a second electrode comprising a light-emitting layer formed to emit radiation during operation of the component;
   a coupling-out layer arranged above the first electrode and/or the second electrode which is in a beam path of the radiation of the light-emitting layer; and
   a protective layer above the coupling-out layer,
   wherein
   the coupling-out layer comprises a structured layer and a planarization layer arranged thereabove and the structured layer has a structured surface structured at least in places,
   the planarization layer planarizes the structured surface of the structured layer,
   the protective layer cannot be removed without at least partially destroying the coupling-out layer, and
   adhesion of the structured layer to the planarization layer is smaller than adhesion of the protective layer to the planarization layer.

2. The organic optoelectronic component according to claim 1, wherein a refractive index of the structured layer and a refractive index of the planarization layer is the same at least in places.

3. The organic optoelectronic component according to claim 1, wherein the structured layer has structures not visible at least in places for a viewer from outside the organic optoelectronic component.

4. The organic optoelectronic component according to claim 1, wherein the structured layer has structures size of 1 Nanometer to 100 Micrometer.

5. The organic optoelectronic component according to claim 1, wherein the structuring is periodic or non-periodic.

6. The organic optoelectronic component according to claim 1, wherein the planarization layer comprises a polymer or consists of a polymer and the polymer is selected from the group consisting of polyimides, polyacrylates, epoxy resins and silicones.

7. The organic optoelectronic component according to claim 1, wherein the planarization layer comprises nanoparticles of a metal oxide at least in places.

8. The organic optoelectronic component according to claim 1, wherein the structured layer is a substrate, a scattering layer or an encapsulation layer.

9. The organic optoelectronic component according to claim 1, wherein the structured layer comprises glass or consists of glass.

10. The organic optoelectronic component according to claim 1, wherein a self-organizing monolayer is arranged between the structured layer and the planarization layer.

11. The organic optoelectronic component according to claim 10, wherein the self-organizing monolayer is formed from thiols, silanes, silanols or phosphonates.

12. The organic optoelectronic component according to claim 1, wherein the planarization layer is formed from a material having adhesive properties.

13. The organic optoelectronic component according to claim 1, wherein the planarization layer and the structured layer comprise the same materials.

* * * * *